United States Patent
Lu et al.

(10) Patent No.: US 9,048,658 B2
(45) Date of Patent: Jun. 2, 2015

(54) RESISTIVE SWITCHING FOR NON VOLATILE MEMORY DEVICE USING AN INTEGRATED BREAKDOWN ELEMENT

(71) Applicant: The Regents of the University of Michigan, Ann Arbor, MI (US)

(72) Inventors: Wei Lu, Ann Arbor, MI (US); Sung Hyun Jo, Sunnyvale, CA (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 14/265,845

(22) Filed: Apr. 30, 2014

(65) Prior Publication Data

US 2014/0233301 A1    Aug. 21, 2014

Related U.S. Application Data

(62) Division of application No. 13/735,814, filed on Jan. 7, 2013, now Pat. No. 8,750,020, which is a division of application No. 12/826,653, filed on Jun. 29, 2010, now Pat. No. 8,351,241.

(60) Provisional application No. 61/358,378, filed on Jun. 24, 2010.

(51) Int. Cl.

| | |
|---|---|
| *G11C 11/00* | (2006.01) |
| *G11C 11/36* | (2006.01) |
| *H02H 9/08* | (2006.01) |
| *G11C 13/00* | (2006.01) |
| *H01L 27/24* | (2006.01) |
| *H01L 45/00* | (2006.01) |

(52) U.S. Cl.
CPC ............. *H02H 9/08* (2013.01); *G11C 13/0007* (2013.01); *G11C 13/003* (2013.01); *G11C 13/004* (2013.01); *G11C 13/0069* (2013.01); *G11C 13/0097* (2013.01); *G11C 2213/33* (2013.01); *G11C 2213/76* (2013.01); *H01L 27/2409* (2013.01); *H01L 27/2463* (2013.01); *H01L 45/04* (2013.01); *H01L 45/08* (2013.01); *H01L 45/085* (2013.01); *H01L 45/1233* (2013.01); *H01L 45/141* (2013.01); *H01L 45/146* (2013.01)

(58) Field of Classification Search
USPC ................................. 365/148, 163, 175, 165
See application file for complete search history.

(56) References Cited

U.S. PATENT DOCUMENTS

| | | | |
|---|---|---|---|
| 7,187,577 | B1 | 3/2007 | Wang et al. |
| 7,786,464 | B2 | 8/2010 | Nirschl et al. |
| 7,829,875 | B2 | 11/2010 | Scheuerlein |
| 7,859,884 | B2 | 12/2010 | Scheuerlein |
| 7,881,097 | B2 | 2/2011 | Hosomi et al. |
| 7,897,953 | B2 | 3/2011 | Liu |
| 7,920,412 | B2 | 4/2011 | Hosotani et al. |
| 7,924,138 | B2 | 4/2011 | Kinoshita et al. |
| 8,004,882 | B2 | 8/2011 | Katti et al. |

(Continued)

*Primary Examiner* — Trong Phan
(74) *Attorney, Agent, or Firm* — Reising Ethington P.C.

(57) ABSTRACT

A method of suppressing propagation of leakage current in an array of switching devices. The method includes providing a dielectric breakdown element integrally and serially connected to a switching element within each of the switching device. A read voltage (for example) is applied to a selected cell. The propagation of leakage current is suppressed by each of the dielectric breakdown element in unselected cells in the array. The read voltage is sufficient to cause breakdown in the selected cells but insufficient to cause breakdown in the serially connected, unselected cells in a specific embodiment. Methods to fabricate of such devices and to program, to erase and to read the device are provided.

22 Claims, 5 Drawing Sheets

(56) References Cited

U.S. PATENT DOCUMENTS

| | | |
|---|---|---|
| 8,018,760 B2 | 9/2011 | Muraoka et al. |
| 8,045,364 B2 | 10/2011 | Schloss et al. |
| 8,067,815 B2 | 11/2011 | Chien et al. |
| 8,102,698 B2 | 1/2012 | Scheuerlein |
| 8,164,948 B2 | 4/2012 | Katti et al. |
| 8,351,241 B2 | 1/2013 | Lu et al. |
| 8,659,933 B2 * | 2/2014 | Jo ................................. 365/148 |
| 8,767,441 B2 * | 7/2014 | Lu et al. ........................ 365/148 |

* cited by examiner

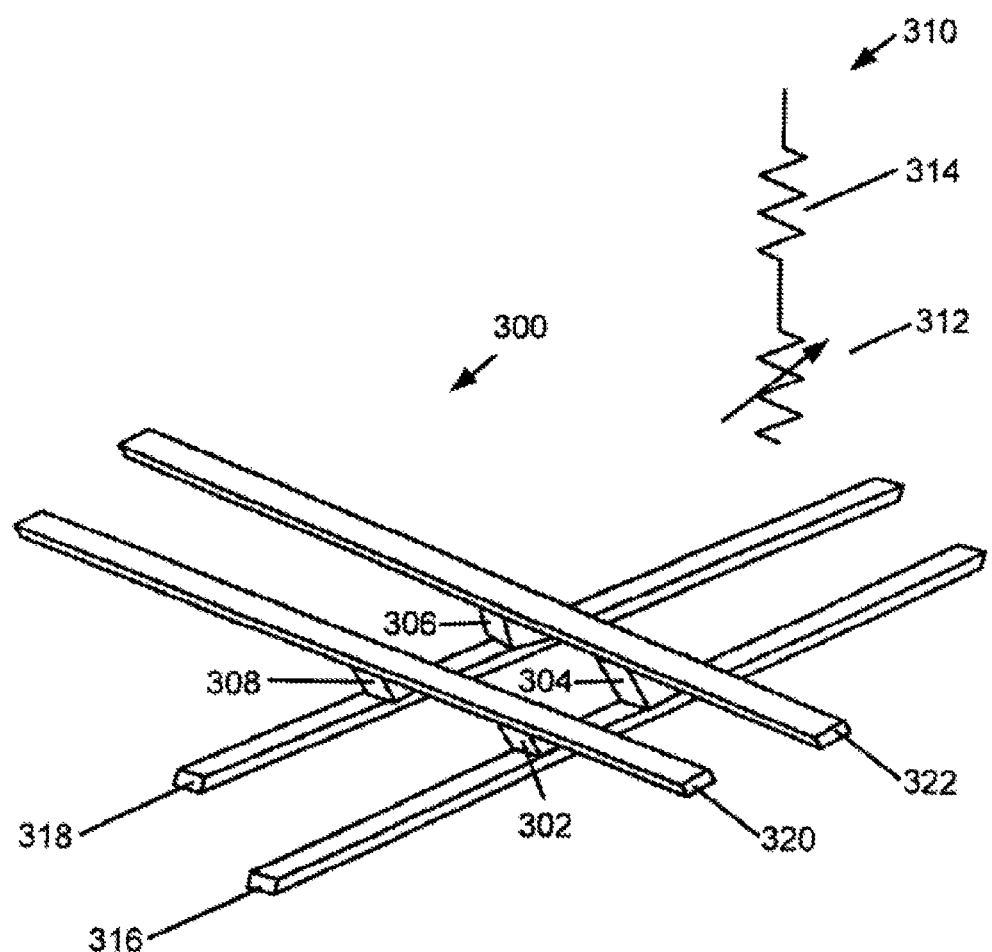
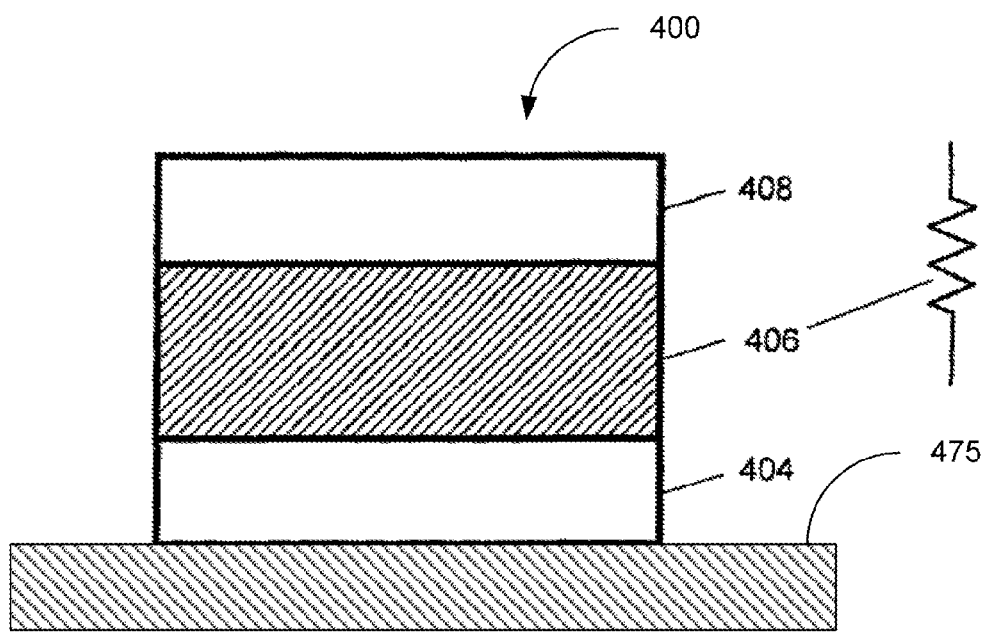
Fig. 3
Fig. 4

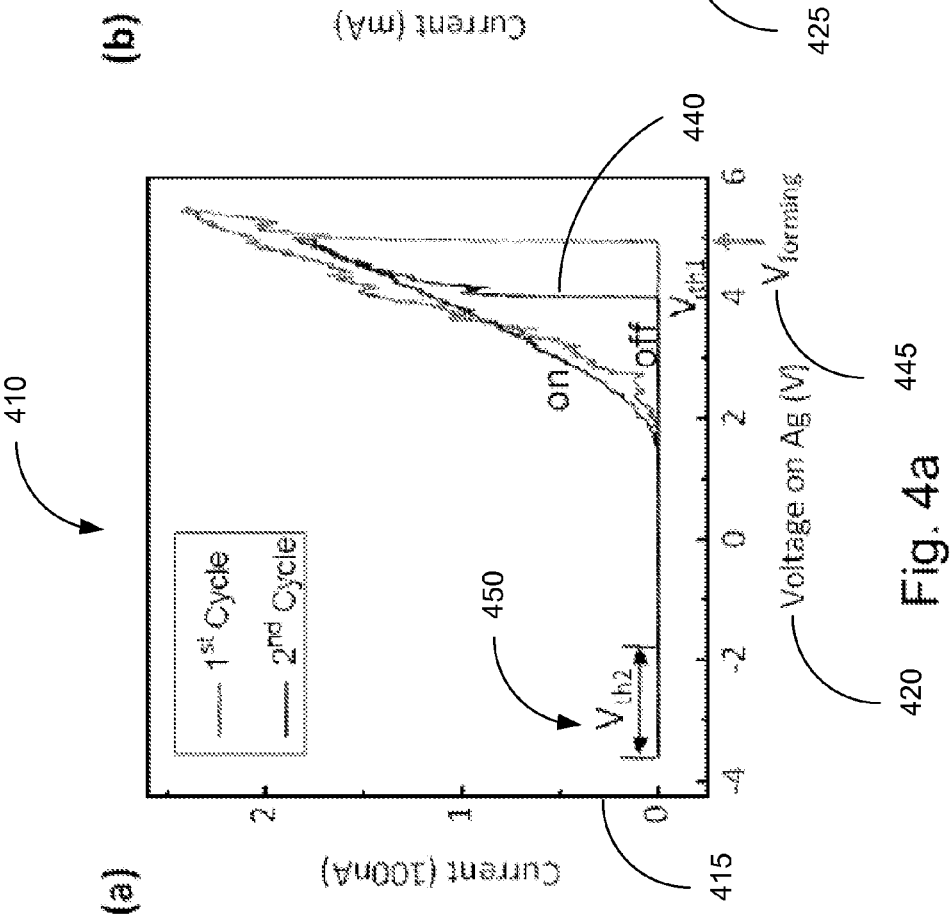

RESISTIVE SWITCHING FOR NON VOLATILE MEMORY DEVICE USING AN INTEGRATED BREAKDOWN ELEMENT

CROSS-REFERENCE TO RELATED APPLICATIONS

This application is a divisional of U.S. patent application Ser. No. 13/735,814, filed Jan. 7, 2013, now U.S. Pat. No. 8,750,020, which is a divisional of U.S. patent application Ser. No. 12/826,653, filed Jun. 29, 2010, now U.S. Pat. No. 8,351,241, which claims the benefit of U.S. Provisional Patent Application No. 61/358,378, filed Jun. 24, 2010. The complete disclosures of these applications are incorporated herein by reference.

STATEMENT RELATED TO FEDERAL FUNDING

This invention was made with government support under CCF0621823 awarded by the National Science Foundation. The government has certain rights in the invention.

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

The present invention is related to switching devices. More particularly, the present invention provides a structure and a method that can be used for forming a non-volatile resistive switching memory devices characterized by a suppression of current at low bias and a high measured ON/OFF resistance ratio.

The success of semiconductor devices has been mainly driven by an intensive transistor down-scaling process. However, as field effect transistors (FET) approach sizes less than 100 nm, problems such as short channel effect start to prevent proper device operation. Moreover, such sub 100 nm device size can lead to sub-threshold slope non-scaling and also increases power dissipation. It is generally believed that transistor based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon based devices to form a memory cell, which lack one or more key attributes. For example, Fe-RAM and MRAM devices have fast switching characteristics and good programming endurance, but their fabrication is not CMOS compatible and size is usually large. Switching for a PCRAM device uses Joules heating, which inherently has high power consumption. Organic RAM or ORAM is incompatible with large volume silicon based fabrication and device reliability is usually poor.

From the above, an improved semiconductor memory device and techniques are therefore desirable.

SUMMARY

The present invention is generally related to switching devices. More particularly, the present invention provides a device structure and a method that can be used for forming a non-volatile memory device that operates using resistive switching. But it should be recognized that embodiments according the present invention have a much broader range of applicability.

In a specific embodiment, a method of suppressing propagation of leakage current in an array of switching devices is provided. The propagation of leakage current in the array of switching devices forms a sneak current within the array. The method includes providing a first switching device, a second switching device, a third switching device, and a fourth switching device. As used herein, the terms first, second, third, and fourth do not generally imply order, and should be interpreted by ordinary meaning. In a specific embodiment, the first switching device, the second switching device and the third switching device are at an ON low resistance state and the fourth switching device is at an OFF high resistance state. The method includes applying a first voltage to the fourth switching device, the first voltage can be, for example, a read voltage $V\_read$ with amplitude lower than a threshold voltage $VT\_RS$ to turn on the fourth switching device and the first voltage causes propagation of leakage current to flow at least in the first switching device, the second switching device and the third switching device. In a specific embodiment, the propagation of leakage current is suppressed or prevented by a dielectric breakdown element integrally and serially connected to a switching element within each of the switching device. In a preferred embodiment, the dielectric breakdown element has a breakdown voltage $VT\_BD$ less than the threshold voltage $VT\_RS$. In a specific embodiment, the dielectric breakdown element provides for an integrated rectifier for the switching device. The integrated rectifier suppresses leakage current at voltages with amplitude below $VT\_BD$.

In a specific embodiment, a resistive switching device structure is provided. The resistive switching device structure includes a first electrode structure spatially disposed in a first direction and a second electrode structure spatially disposed in a second direction not parallel to the first direction. A resistive switching element is sandwiched between the first electrode structure and the second electrode structure. In a specific embodiment, the resistive switching element is configured to change in resistance when a voltage applied between the first electrode and the second electrode is greater than a first threshold voltage. As used herein, the term threshold should be interpreted by ordinary meaning. That is, the first threshold voltage can be an operating voltage such as turn on voltage, erase voltage, and others. In a specific embodiment, a dielectric breakdown element is serially connected to the resistive switching element and disposed between the resistive element and the first electrode structure. In a preferred embodiment, the dielectric breakdown element is characterized by a breakdown voltage less than the first threshold voltage. Preferably, the dielectric breakdown element provides for an integrated rectification, for example current rectification, for the device.

Many benefits are achieved by ways of the present invention over conventional techniques. For example embodiments of the present invention allow for a high density non-volatile device characterized by high switching speed, improved leakage current characteristic, and high device yield. Depending on the embodiment, one or more of these benefits may be achieved. These and other benefits will be described in more detail throughout the present specification and more particularly below.

BRIEF DESCRIPTION OF THE DRAWINGS

FIG. 3 is a simplified diagram illustrating a method of suppressing a sneak current in an array of switching devices according to an embodiment of the present invention.

FIG. 4 is a simplified diagram illustrating a switching device structure that includes intrinsic current rectification, with FIGS. 4a and 4b showing I-V plots for switching devices with and without rectification, respectively.

DETAILED DESCRIPTION

The illustrated embodiment described below is generally directed to a memory device that uses a resistive switching device having integrated rectification functionality. The switching device may be used in a RRAM or ReRAM or any highly interconnected and highly integrated devices. But it should be recognized that embodiments of the present invention can have a broader range of applicability.

RRAM can be a two terminal device in which a switching element is sandwiched between a top electrode and a bottom electrode. The resistance of the switching element is varied by applying a voltage to the electrodes or a current through the switching element. Resistive switching can be bipolar or unipolar. In bipolar switching, the change in resistance of the switching element depends on polarity and a magnitude of an applied voltage or an applied current. In the case of unipolar switching, the change in resistance of the switching element depends only on the magnitude of the applied voltage or current and typically a result of Joule heating within the switching element.

Resistive switching can be made non-volatile with data storage lasts for many years. Depending on the device structure and material selected, RRAM can have a switching speed in the nanosecond (<1 nanosecond to a few hundred nanoseconds) range. A crossbar configuration in which the top electrode and the bottom electrode are arranged in orthogonal manner further allows for high density, random access, and 3D stacking devices. An array of such crossbar structures includes a plurality of parallel top electrodes and a plurality of parallel bottom with respective switching elements in between the intersection regions of the top electrodes and the bottom electrodes. Certain limitations exist in such a configuration as describe below.

Figure 1:
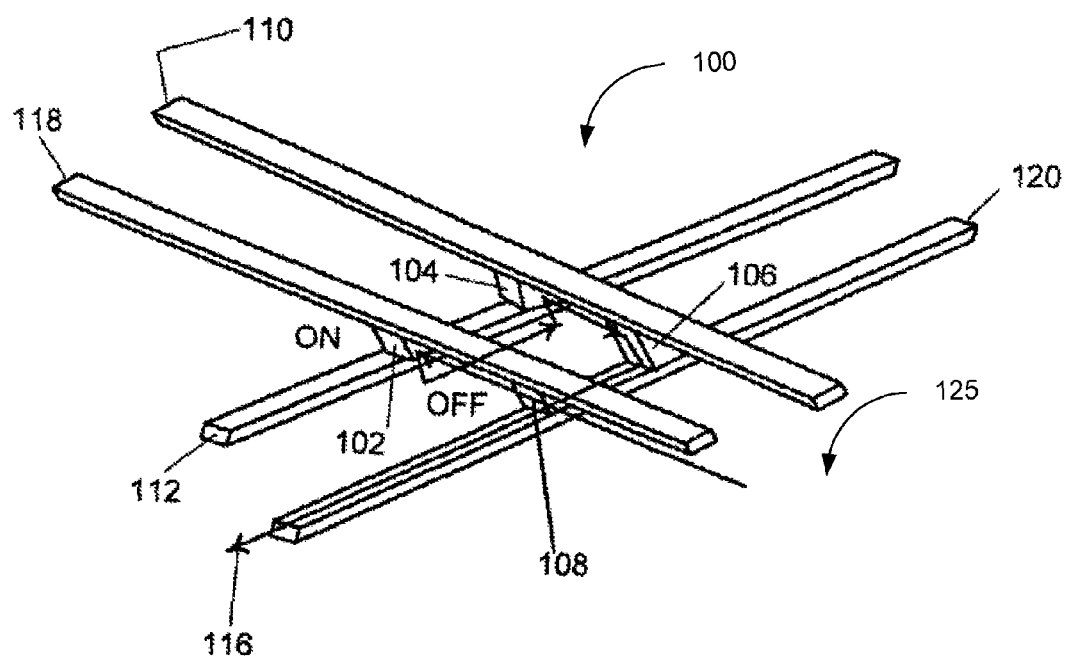
FIG. 1 is a simplified diagram of a portion of an array of resistive switching memory cells, four cells are illustrated.

FIG. 1 is a simplified diagram illustrating a portion of an array 100 of resistive switching memory cells formed upon a semiconductor substrate 125. Four memory cells 102, 104, 106, and 108 arranged in a cross bar configuration are illustrated. As shown, switching device 104 and 106 has a common first top electrode 110, device 102 and device 108 has a common second top electrode 118. The first top electrode and the second top electrode are arranged parallel to each other. Switching device 102 and switching device 104 has a common first bottom electrode 112 and device 106 and device 108 have a common second bottom electrode 120. The first bottom electrode and the second bottom electrode are spatially arranged parallel to each other. Each of the top electrodes is configured to be non-parallel to each of the bottom electrode. Each of the top electrode and the bottom electrode can be nanowires in certain implementation.

Figure 2:
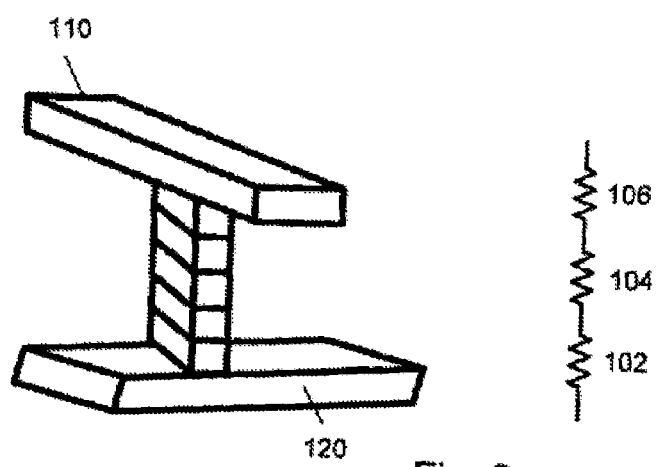
FIG. 2 is simplified diagram illustrating an equivalent cell structure and a corresponding circuit representation of the array of memory cells in FIG. 1 when a voltage is applied to cell 108 and current flows through cells 102, 104, and 106.

To determine a state of a target cell, which is at a high resistance state, a voltage is applied and a current flowing through the target cell is measured. If neighboring cells are in low resistance states, the voltage applied to the target cell can cause a leakage current to flow in one or more of the neighboring cell. As the neighboring cells, including the target cell, are interconnected, the leakage current can form a current path commonly known as a sneak current or a sneak current path through the neighboring cells. This sneak current can cause an incorrect high current being read in the target cell. As an example, cells 102, 104, and 106 are at a low resistive ON state, cell 108 is at a high resistive OFF state. When a voltage is applied to cell 108, an erroneous reading of a high read current may be obtained when trying to read the state of 108 even though it may be in the high resistance OFF state. Leakage current or sneak current paths such as 116 through the three low resistive ON state cells 102, 104, and 106 can exist. The shortest sneak path can contain two forward biased cells and one reverse biased cell. In some instances resistance for cells in the ON state can be low in both forward and reversed bias. Additionally, once started, the sneak path would propagate throughout the entire array of devices and 116 is just an example of one possible sneak path. An equivalent cell structure and a corresponding circuit representation for path 116 are shown in FIG. 2. To suppress the sneak current path, certain current steering methods have been used. One approach is to use one or more external diodes at each junction of the resistive switching element. The diode can be a metal oxide Schottky diode or a PN based diode provided in series with the switching element. Such implementation is inherently not feasible with a bipolar switching device. As the resistive element is to be turned off uses a negative bias, the diode would need to be in a reversed bias state and would consume a large portion of the voltage applied, and preventing the cell to be programmed (turned off). In addition, diode in nano-scale may not be even functional due to tunneling effects, carrier depletion in the semiconductor and limits in aspect ratio for practical devices. Accordingly, though such crossbar structure can provide a highly connected high density device, implementation is difficult due to leakage current and sneak paths as described. In addition, the four cells can be any four cells in the array that share a common top electrode or a common bottom electrode.

Accordingly, embodiments according to the present invention provide a method and a device structure for suppressing a sneak current in an array 300 of devices shown in FIG. 3, for example, switching devices. As shown, four devices in an N(>1) by M(>1) array arranged in a crossbar configuration are illustrated: a first switching device 302, a second switching device 304, a third switching device 306, and a fourth switching device 308. The first switching device and the second switching device have a common first bottom electrode 316, the third switching device and the fourth switching device have a common second bottom electrode 318, the first switching device and the fourth switching device have a first common top electrode 320, and the second switching device and the third switching device have a common second top electrode 322. Each of the bottom electrodes is spatially configured parallel to each other and each of the top electrodes is spatially configured parallel to each other. Additionally, the first top electrode is arranged spatially non-parallel to each of the bottom electrodes and the second top electrode is arranged spatially non-parallel to each of the bottom electrodes. In certain embodiments, the first top electrode is orthogonal to each of the bottom electrodes and the second top electrode is orthogonal to each of the bottom electrodes. Depending on the embodiments, each of the top electrodes and each of the bottom electrodes may be implemented as nanowires.

Although the switching devices shown in FIG. 3 (and FIG. 1) are neighboring, sneak paths may be formed from any devices in the crossbar array that are connected to the fourth switching device by ways of the top electrode or the bottom electrode. Therefore these neighboring devices merely illustrate a shortest sneak path in a crossbar array.

As merely an example, the first switching device, the second switching device and the third switching device is at an ON low resistance state, the fourth switching device are each at an OFF high resistance state. To operate the fourth switching device, a first voltage is applied to the fourth switching device. The first voltage can be a threshold voltage to turn on the fourth switching device or an operating voltage for the device. The first voltage can also be a reading voltage for the fourth switching device depending on the embodiment. In a specific embodiment, the sneak current is suppressed by having a breakdown element 312 integrally and serially connected to a switching element 314 within each of the switching device as shown in a simplified circuit diagram 310. The breakdown element is characterized by a breakdown voltage less than the threshold voltage in a specific embodiment. In a preferred embodiment, the breakdown voltage is less than about half of the threshold voltage. In a specific embodiment, the dielectric breakdown element provides for an integrated leakage current suppression element in each of the switching element.

Depending on the device structure, intrinsic current rectification can be achieved in which the current is suppressed at reverse bias. An exemplary device 400 is shown in FIG. 4. Such a device structure is described in U.S. Patent Application Publication Nos. 2009/0014707 (application Ser. No. 11/875,541 filed Oct. 19, 2007) and 2010/20085798 (application Ser. No. 12/575,921 filed Oct. 8, 2009), both of which are incorporated by reference in their entirety herein. The device structure is exemplified using a p+ silicon electrode 404, shown on a metal electrode 475 (e.g. tungsten), an amorphous silicon switching element 406 and a top metal electrode 408. In FIG. 4, amorphous silicon switching element 406 is illustrated as a resistive element. A current 415 versus voltage 420 representation 410 of the rectification of device 400 is shown also shown in FIG. 4a. Illustrated are a threshold voltage 440, an initial forming voltage 445, and a negative threshold voltage 450, as discussed in the above-referenced applications. The intrinsic rectification is not always observed in other bipolar switching devices when other materials or device structures are used. For example, a symmetric current 425 versus voltage 430 plot 435 was shown in FIG. 4b without current rectification. Illustrated are a threshold voltage 455 and a negative threshold voltage 460, as discussed in the above-referenced applications. In such cases, at low reverse bias voltage, current flow in the device needs to be suppressed to ensure no false ON is possible due to the sneak path problem discussed above.

Figure 5:
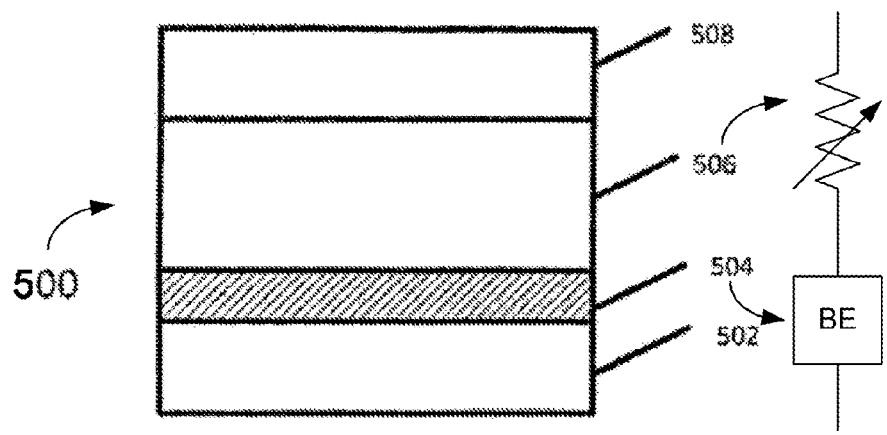
FIG. 5 is a simplified diagram illustrating a switching device structure with rectification according to an embodiment of the present invention.

FIG. 5 is a simplified diagram illustrating a resistive switching device structure 500 according to an embodiment of the present invention. As shown, device structure 500 includes a dielectric breakdown layer 504 configured in between a bottom electrode 502, and a resistive switching layer 506. A top electrode 508 overlies the resistive switching layer. The dielectric breakdown layer is configured to have a breakdown voltage that allows for a soft and reversible breakdown in a specific embodiment. In a specific embodiment, the breakdown voltage is less that the threshold voltage for resistive switching. In certain embodiments, the breakdown voltage is less that about half of the threshold voltage for resistive switching. In a specific embodiment, the soft breakdown of the dielectric breakdown layer provides for leakage current suppression of the resistive switching device, that is, at low (specifically, reverse) bias voltage, current flow is suppressed according to a preferred embodiment. In a specific embodiment, the top electrode and the bottom electrode are arranged spatially in an orthogonal manner to form an array of interconnected crossbar structures. Terms such as "top" or "bottom" are for illustrative purpose only and should not construe to be limiting.

In a specific embodiment, the bottom electrode may be formed using a metal such as tungsten, aluminum, copper, or other suitable metal materials. Depending on the embodiment, the bottom electrode may be formed using doped polysilicon material. In other embodiments, single crystal silicon may also be used. In this instance, the single crystal silicon is doped with a suitable impurity species.

As shown in FIG. 5, dielectric breakdown element (BE) 504 overlies the bottom electrode. The dielectric breakdown element is characterized by a breakdown voltage that is less than a threshold voltage (for example a turn-ON voltage) for the non-volatile memory device. The dielectric breakdown element is configured to have a soft breakdown or a reversible breakdown. In a specific embodiment, the breakdown voltage can be adjusted by adjusting a thickness or a dielectric constant, a workfunction of the dielectric breakdown element or a combination. In a specific embodiment, the dielectric breakdown element is provided by a suitable dielectric material, such as silicon dioxide, silicon nitride, a dielectric stack, high K dielectric material, any combinations of these, and others. As merely an example, the dielectric breakdown element is formed using an oxide dielectric material such as Hf02 having a dielectric constant of about 20 and at a thickness of about 1 nm. In a specific embodiment, the Hf02 can be deposited using an atomic layer deposition (ALD) process or a suitable chemical vapor deposition (CVD) process. Alternatively, the dielectric Hf02 may be deposited using a physical vapor deposition process. Of course one skilled in the art would recognized other variations, modifications, and alternatives.

Referring again to FIG. 5, resistive switching element 506 overlies the dielectric breakdown element. The resistive switching element may be formed using material including metal oxides such as ZnO, $WO_3$, TiOx, NiO, CuO, or chalcogenide glass, organic materials, polymeric materials (inorganic and organic), and others. In certain embodiment, switching materials that exhibit phase change upon applying heat or electric field may be used. In other embodiments, resistance of the switching material may be changed by an injection or redistribution of ions, oxygen vacancies, or impurities. In a specific embodiment, the resistivity switching element uses amorphous silicon material deposited using chemical vapor deposition (CVD) including plasma enhanced CVD, low pressure CVD, and others. Other techniques such as physical vapor deposition (PVD) may also be used depending on the application. The amorphous silicon material is un-doped or intrinsic in a specific embodiment. In a specific embodiment, the resistive switching element is characterized by a change in resistance when a voltage applied between the first electrode and the second electrode is greater than a first threshold voltage.

In a specific embodiment, the switching device includes top electrode 508 overlying the resistive switching layer. The top electrode can be a metal material deposited using techniques such as physical vapor deposition, chemical vapor deposition, or electrochemical deposition such as electroplating, depending on the metal material used. The second electrode structure may also use other conductor materials such as a doped semiconductor material depending on the application. In a specific embodiment, the second electrode structure is provided using a metal such as tungsten, aluminum, noble metals such as gold, silver, platinum, and the like. One skilled in the art would recognize other variations, modifications, and alternatives. For example, the position of the dielectric breakdown layer 504 and switching element 506 can be swapped. Or, a tungsten or other conductive intermediate layer can be included between the breakdown element 504 and switching device 506 that provides a well defined transition between them, although this may result in higher programming currents possibly due to a higher defect density between the switching device 506 and intermediate layer.

Depending on the embodiment, the resistive switching element is characterized by a resistance depending on an amount of metal particles (ions, atoms, or clusters) from the top electrode injected into the resistive switching layer. In certain embodiment, the metal particles (ions, atoms or clusters) can form a filament structure in the switching layer. In cases where the switching material is a metal oxide, resistive switching may depend on a conducting path, vacancy migration or electrochemical or redox processes.

Figure 6:
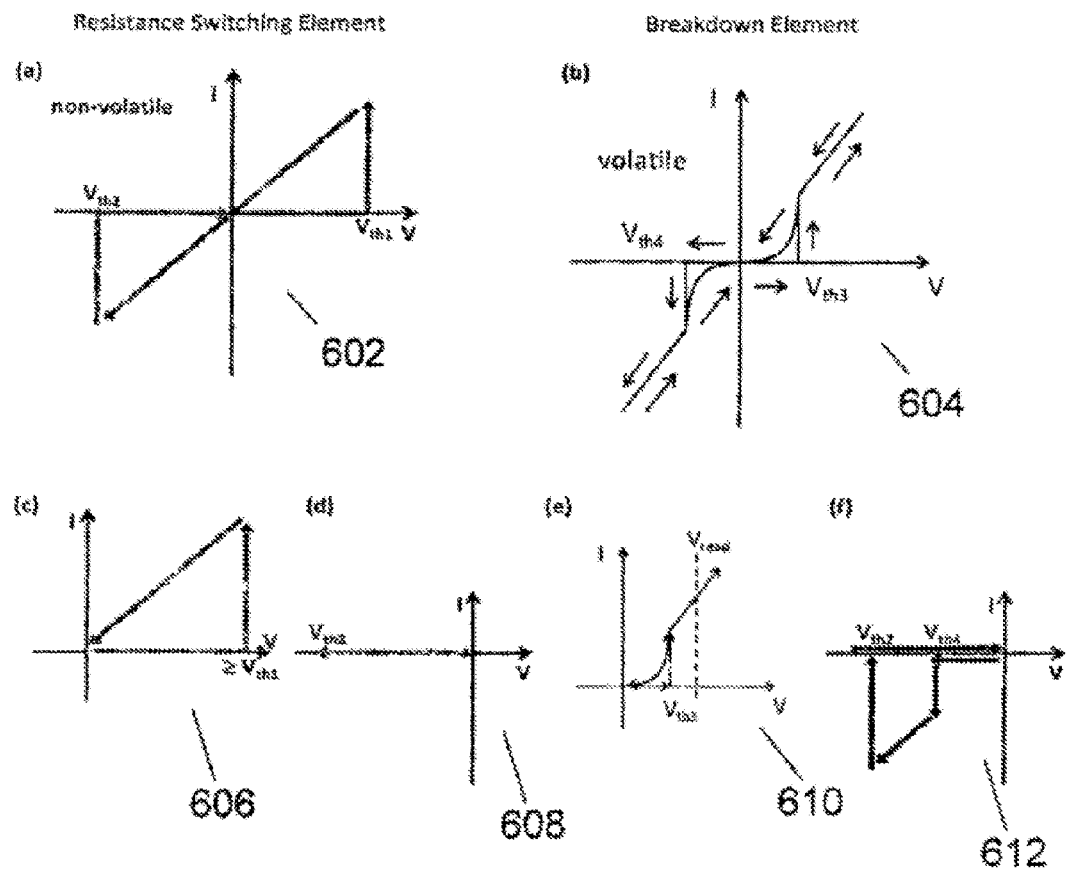
FIG. 6 illustrates schematic IV plots of a switching device with leak current suppression according to an embodiment of the present invention.

Referring to FIG. 6, various combined effects of non-volatile resistive switching and breakdown are illustrated. As shown, the switching device and the breakdown element (or rectifier device) are arranged in series. Plot 602 is a simplified IV plot of a resistive switching element. As shown, the resistive switching element is non-volatile, having a forward threshold voltage of Vth1 and a reversed threshold of Vth2. Plot 604 is a simplified IV curve for a breakdown element. As shown, the soft breakdown of the breakdown element is volatile. When the voltage applied is greater than a threshold voltage (positive Vth3 or negative Vth4), current flows in the breakdown element. When the voltage is decreased below the threshold or removed, the breakdown element reverts back to its original state. In addition, dielectric breakdown depends mainly on magnitude of the applied voltage while for a bipolar resistive switching device; resistance switching depends on both the polarity and the magnitude of the applied voltage.

Plots 606, 608, 610, and 612 are IV curves of a combined resistive switching element and a dielectric breakdown element arranged in series according to embodiments of the present invention. The soft breakdown voltage of the dielectric breakdown element is less than the threshold ON voltage or the threshold OFF voltage of the resistive switching element according to a specific embodiment.

Plot 606 is an IV curve of the resistive switching element during writing when the initial state is OFF. A positive voltage greater than threshold Vth1 is applied to the top electrode. This causes both the resistive switching element and the dielectric breakdown element to be at an ON state. During reading, a positive voltage greater than the breakdown voltage Vth3 and less than threshold voltage Vth1 causes soft breakdown of the dielectric breakdown element and the device is still at ON state for reading as illustrated in Plot 610. When a negative bias less negative than Vth4 is applied, there is no change in state of the device since the dielectric breakdown element is in the high resistance state.

When a negative voltage more negative than the breakdown voltage Vth4 is applied to the top electrode, soft breakdown occurs in the dielectric breakdown element and a high (or low) current can flow through the resistive switching device when its conductance is high (or low). Additionally, when the voltage applied is more negative than threshold voltage Vth2, the resistive switching device (if it is initially in the ON state) will be switched to an OFF state as shown in plot 612. If the resistive switching device is initially in the OFF state, a very small current may pass through it at negative biases.

Figure 7:
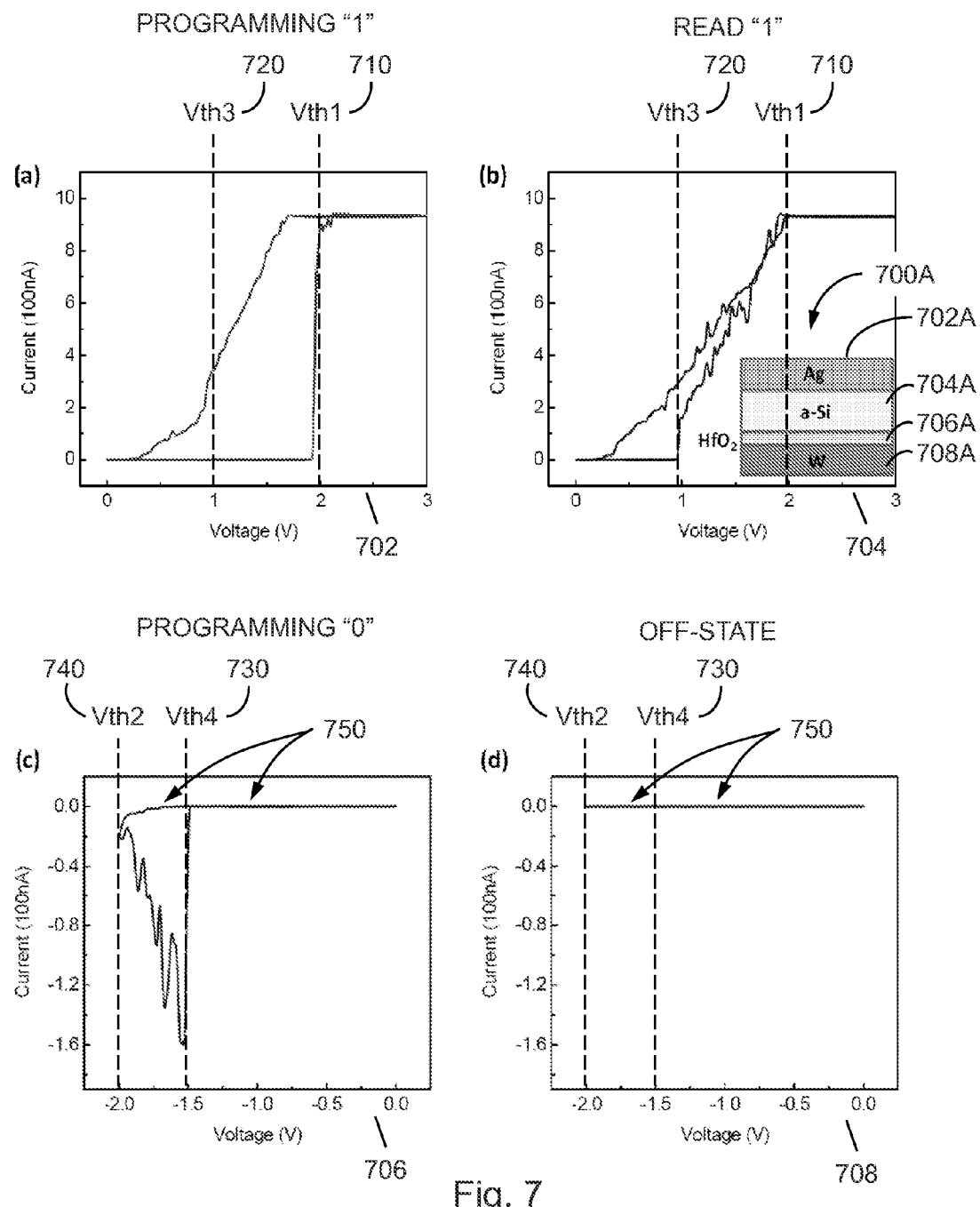
FIG. 7 illustrates experimental IV plots according to an embodiment of the present invention.

To verify the concept, a resistive switching device 700A with a dielectric breakdown layer was fabricated. The device structure 700A is illustrated in FIG. 7. The resistive switching device includes the following:

Top electrode 702A: silver, formed by Ag lift off;
Resistive Switching layer 704A: a-Silicon (a-Si), deposited by plasma enhanced chemical deposition process (PECVD);
Dielectric breakdown layer 706A: HfO2 deposited using atomic layer deposition (ALD) process;
Bottom electrode layer 708A: tungsten deposited by sputtering.

Device structure 700 is merely an example and should not limit the scope of the claims herein. One skilled in the art would recognized other variations, modifications, and alternatives. For example, other electrodes or combination of electrodes may be used. Other switching material such as metal oxides may be used. In addition, other dielectric materials or a combination of dielectric materials may be also used for the dielectric breakdown element depending on the application.

FIG. 7 illustrates resulting IV plots for device structure 700 having a device size of about 120 nm×120 nm. Plot 702 is an IV curve of the resistive switching device during write when a positive voltage exceeding a threshold write voltage is applied to the top electrode and the device is at ON state. As shown, the threshold write voltage Vth1 710 is about 2 volts, and a breakdown voltage Vth3 720 is about 1 volt.

Plot 704 is an IV curve of the device during read from an ON state. The voltage applied is greater than the breakdown voltage Vth3 and less that the threshold voltage Vth1.

Plot 706 is an IV curve of the device during erase. A negative bias voltage greater than the breakdown voltage Vth4 730 and less that the threshold voltage Vth2 740 applied to the top electrode does not change the state of the device until the negative bias voltage is more negative that the threshold voltage Vth2 740 and the device is erased to an OFF state 750 as shown in Plot 708. A negative bias does not turn on the device and the device stays in the OFF state.

In a specific embodiment, the breakdown voltage for the dielectric breakdown element is substantially symmetrical, that is the positive breakdown voltage Vth3 and the negative breakdown voltage Vth4 has about the same magnitude. In other embodiments, asymmetrical breakdown may be achieved by engineering the electrodes and/or the dielectric material for the dielectric breakdown element, allowing the positive breakdown voltage Vth3 and the negative breakdown voltage Vth4 to have different magnitudes. Depending on the application, Vth3 and Vth4 can be adjusted to allow for appropriate operation of the integrated breakdown/resistive switching device. In a specific embodiment, such adjustment may be achieved by using a different dielectric material/dielectric stack, or a dielectric thickness, interfaces between the dielectric material and each of the electrodes, work functions of each of the electrodes, and others. In the following Vbd is used to represent Vth3 or Vth4 for simplicity.

Adding the dielectric breakdown element allows for the integrated device to suppress current at low voltage and does not require additional voltage budget for read or write or erase process when the breakdown voltage of the dielectric layer is less than a minimum of half of that of the write voltage and the erase voltage or mathematically:

$$|Vbd|<\min(|V_{read}|,|V_{RS\text{-}write}/2|,|V_{RS\text{-}erase}|),$$

where $V_{RS\text{-}write}$ is the write voltage of the resistive switching device and $V_{RS\text{-}erase}$ is the erase voltage of the resistive switching device.

Depending on the state of the switching device, there can be variations. Referring to FIG. 1, the shortest sneak path in the crossbar structure comprises three neighboring devices (for example 102, 104, 106) all of which are at low resistance ON-state. As described, there may be many such sneak paths in parallel involving three cells or more. In this example, device 108 is a target cell for reading, writing or erasing.

In a specific embodiment, an array of switching devices having integrated breakdown elements is provided. The array includes a target cell after writing. To read the target cell, a read voltage $V_{read}$ greater than the breakdown voltage of the breakdown element but less than the write voltage for the device is used in a specific embodiment. Such read voltage is to avoid unintentional writing into the device during read. Preferably, the read voltage is less than a voltage that can cause a total breakdown in a plurality n of serially-connected cells in the sneak path. Or mathematically, $$V_{BD}<V_{read}<\min(nV_{BD},V_{write})$$

where $V_{BD}$ is the breakdown voltage of the breakdown element, $V_{write}$ is the write voltage of the device, n=3 for the shortest sneak paths involving 3 cells and n>3 for other sneak paths involving more cells.

For the example in FIG. 1, the voltage needed to cause breakdown in the shortest sneak path that involves 3 serially-connected cells is $3V_{BD}$. The resistance in the sneak path (for example 116 in FIG. 1) can be represented by $3R_{insulator}$ during read where $R_{insulator}$ is the resistance of each of the breakdown element prior to dielectric breakdown. In a specific embodiment, $R_{insulator}$ is greater than $R_{on}$. The breakdown element within each of the devices provides orders of magnitude reduction of the leakage current for the array when $R_{insulator}>>R_{on}$ in a preferred embodiment.

In an alternative embodiment, an array of switching devices having integrated breakdown elements is provided. The array includes a target cell for programming. In a specific embodiment, the breakdown element added to the resistive switching element almost does not require additional voltage overhead and can be programmed with substantially the same voltage as needed for the switching element alone. Various examples are given in Table 1.

In a specific embodiment, a breakdown element having a resistance $R_{insulator}$ much larger than an off-state resistance of the resistive switching element $R_{off}$ is provided. A large portion of the applied voltage drops across the breakdown element in a preferred embodiment. Consequently, applying threshold voltage of programming ON for the resistive switching element will first cause breakdown followed by the programming of the device.

Again, depending on the embodiment, there can be other variations. For example, in the case of $R_{insulator} \approx R_{off}$, voltage dividing effect requires that programming voltage should not be smaller than $\max(2V_{BD},V_{th1})$ for successful programming in a preferred embodiment.

In another example where $R_{insulator}<<R_{off}$, switching can be initiated before breakdown. Since $R_{on}<<R_{insulator}$, breakdown can still proceed after (or during) ON programming. In a specific embodiment, programming voltage larger than, for example, $\max(2V_{BD},V_{th1})$ will ensure that breakdown of the insulator and complete the writing process. Accordingly, if the breakdown element is engineered to satisfy $2V_{BD} \leq V_{th1}$, no voltage overhead is required during the programming process, where $V_{th1}$ is a threshold voltage for the resistive switching, in the absence of the breakdown element.

In yet another example, for erasing, since $R_{insulator}>>R_{on}$, breakdown occurs when the magnitude of an applied voltage is greater than $|V_{BD}|$, allowing erasing to proceed successfully as long as $|V_{th2}|>V_{BD}$, where $V_{th2}$ is the erase voltage of the switching device in the absence of a breakdown element.

In summary, by adding the breakdown layer the programming voltage may need to be increased by an amount of $2V_{BD}-V_{th1}$. In the case the breakdown layer and the resistive switching layer are properly engineered so that $|V_{BD}|<\min(|V_{th1}/2|,|V_{th2}|)$, no programming voltage overhead is required in the integrated resistive switching/breakdown device, Various examples for programming is illustrated in Table 1 below. Of course one skilled in the art would recognize other variations, modifications, and alternatives.

TABLE I

Programming voltages required for a resistive switching device with integrated breakdown element

| Case | | Programming Voltage | Note |
|---|---|---|---|
| 1 | $R_{insulator} >> R_{off}$ | $V_{th1}$ | Breakdown followed by programming |
| 2 | $R_{insulator} << R_{off}$ | $\max(2V_{BD},V_{th1})$ | Programming followed by breakdown |
| 3 | $R_{insulator} \approx R_{off}$ | $\max(2V_{BD},V_{th1})$ | Breakdown followed by programming |
| 4 | $R_{insulator} >> R_{on}$ | $\max(V_{BD},|V_{th2}|)$ | Breakdown followed by erasing |

Embodiments of the present invention have been described using certain materials, including certain semiconductor materials and metal materials. A switching device having a breakdown element can have important benefits and applications for other types of materials. For example, resistive switching devices based on organic materials usually suffer from low off/on resistance ratio (a few tens-hundreds) due to low $R_{off}$. The low off/on resistance ratio limits such materials' application prospect even though the materials may offer excellent scaling potential. By using a breakdown layer, the off-state current during read will be limited by the resistance of the breakdown layer $R_{insulator}$ (Case 1 in Table 1) that can result in significantly improved off/on resistance ratio. This will allow several otherwise non-ideal switching materials for practical memory or logic application.

It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method for reading a memory cell, comprising:
providing a plurality of memory cells in an array, each of the memory cells comprising a switching device and an integrated breakdown element, the integrated breakdown element being serially connected to the switching device;

applying a write voltage to a selected memory cell within the plurality of memory cells to cause the selected memory cell to be in a write state; and applying a read voltage to the selected memory cell, the read voltage being less than a sum of a plurality of breakdown voltages and being less than the write voltage, the plurality of breakdown voltages being respectively associated with a plurality of the integrated breakdown elements forming a sneak path among the memory cells associated with the plurality of integrated breakdown elements.

2. The method of claim 1 wherein the write voltage is greater than about twice a breakdown voltage of an integrated breakdown element for the selected memory cell.

3. The method of claim 1 wherein the read voltage is greater than a breakdown voltage of an integrated breakdown element for the selected memory cell.

4. The method of claim 3 wherein, when applying the read voltage to the selected memory cell, voltages applied across a set of memory cells from the plurality of memory cells excluding the selected memory cell are less than breakdown voltages of integrated breakdown elements of the set of memory cells.

5. The method of claim 1 wherein the applying the write voltage comprises disposing metal particles from a top electrode adjacent to the switching device into the switching device to form a filament structure therein.

6. The method of claim 5:
wherein the metal particles are selected from a group consisting of tungsten aluminum, gold, silver, and platinum; and
wherein the resistive switching element comprises an un-doped silicon-containing material.

7. The method of claim 1 wherein the integrated breakdown element is selected from a group consisting of: an oxide dielectric material and HfO2.

8. A method for writing a memory cell, comprising
providing an array of memory cells, each of the memory cells comprising a switching device and an integrated breakdown element, the integrated breakdown element being serially connected to the switching device; and
applying a write voltage to a selected memory cell to cause the memory cell to be in a write state, the write voltage being no smaller than twice a break down voltage of the breakdown element.

9. The method of claim 8 wherein the write voltage of the selected memory cell is substantially the same as a first write voltage of the switching device of the selected memory cell.

10. The method of claim 8 wherein the write voltage is greater than about twice a breakdown voltage of an integrated breakdown element for the selected memory cell.

11. The method of claim 8 wherein the applying the write voltage comprises disposing metal particles from a top electrode adjacent to the switching device into the switching device to form a filament structure therein.

12. The method of claim 11:
wherein the metal particles are selected from a group consisting of tungsten aluminum, gold, silver, and platinum; and
wherein the resistive switching element comprises an un-doped silicon-containing material.

13. The method of claim 8 wherein the integrated breakdown element is selected from a group consisting of: an oxide dielectric material and HfO2.

14. The method of claim 11 further comprising:
selecting the memory cell from the array of memory cells to be erased, the selected memory cell being in the write state; and
applying an erase voltage to the selected memory cell during an erase cycle to cause the selected memory cell to change from the write state to an erase state, the magnitude of the erase voltage being greater than the magnitude of an erase breakdown voltage of the breakdown element of the selected memory cell.

15. A method for erasing a memory cell, comprising:
providing an array of memory cells, each of the memory cell comprising a switching device and an integrated breakdown element, the integrated breakdown element being serially connected to the switching device;
selecting a memory cell from the array of memory cells to be erased, the selected memory cell being in a write state; and
applying an erase voltage to the selected memory cell during an erase cycle to cause the selected memory cell to change from the write state to an erase state, the magnitude of the erase voltage being greater than the magnitude of a breakdown voltage of the breakdown element of the selected memory cell.

16. The method of claim 15 wherein the erase voltage of the selected memory cell is substantially the same as a first erase voltage of the switching device of the selected memory cell.

17. The method of claim 15 further comprising:
applying a read voltage to the memory cell, the read voltage being less than a write voltage associated with the memory cell and being larger than a read breakdown voltage of the integrated breakdown element; and
wherein the write voltage is greater than about twice the read breakdown voltage of the integrated breakdown element.

18. The method of claim 17 wherein the magnitude of the erase voltage is greater than the magnitude of an erase breakdown voltage of the integrated breakdown element, and wherein the magnitude of the erase breakdown voltage is substantially similar to the magnitude of the read breakdown voltage.

19. The method of claim 15 wherein, when applying the erase voltage to the selected memory cell, magnitudes of voltages applied across a set of memory cells from the plurality of memory cells excluding the selected memory cell are less than magnitudes of breakdown voltages of integrated breakdown elements of the set of memory cells.

20. The method of claim 15 wherein the applying the erase voltage comprises breaking a filament in the switching device that is formed of metal particles injected from a top electrode into the switching device.

21. The method of claim 20:
wherein the metal particles are selected from a group consisting of tungsten aluminum, gold, silver, and platinum; and
wherein the resistive switching element comprises an un-doped silicon-containing material.

22. The method of claim 15 wherein the integrated breakdown element is selected from a group consisting of an oxide dielectric material and HfO2.

* * * * *

UNITED STATES PATENT AND TRADEMARK OFFICE
CERTIFICATE OF CORRECTION

PATENT NO.       : 9,048,658 B2  
APPLICATION NO.  : 14/265845  
DATED            : June 2, 2015  
INVENTOR(S)      : Lu et al.

Page 1 of 1

It is certified that error appears in the above-identified patent and that said Letters Patent is hereby corrected as shown below:

Claim 6, column 11, line 33, insert --,-- after the word "tungsten".

Claim 12, column 11, line 61, insert --,-- after the word "tungsten".

Claim 21, column 12, line 57, insert --,-- after the word "tungsten".

Signed and Sealed this
Third Day of May, 2016

Michelle K. Lee
*Director of the United States Patent and Trademark Office*